US005856236A

United States Patent [19]
Lai et al.

[11] Patent Number: 5,856,236
[45] Date of Patent: *Jan. 5, 1999

[54] METHOD OF DEPOSITING A SMOOTH CONFORMAL ALUMINUM FILM ON A REFRACTORY METAL NITRIDE LAYER

[75] Inventors: Gilbert Lai; Gurtej S. Sandhu; Ravi Iyer, all of Boise; Brian A. Vaartstra, Nampa, all of Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 663,996

[22] Filed: Jun. 14, 1996

[51] Int. Cl.⁶ .................................................. H01L 21/44
[52] U.S. Cl. ........................ 438/681; 438/683; 438/685
[58] Field of Search ............................ 437/192; 438/681

[56] References Cited

U.S. PATENT DOCUMENTS

| | | | |
|---|---|---|---|
| 5,252,518 | 10/1993 | Sandhu et al. | 437/200 |
| 5,254,499 | 10/1993 | Sandhu et al. | 437/192 |
| 5,364,664 | 11/1994 | Tsubouchi et al. | 427/535 |
| 5,393,699 | 2/1995 | Mikoshiba et al. | 437/187 |
| 5,523,259 | 6/1996 | Merchant et al. | 437/190 |
| 5,604,155 | 2/1997 | Wang | 437/190 |

OTHER PUBLICATIONS

Butler, "Options for Multilevel Metallization", *Solid State Technology*, Mar. 1996, pp. 7–10.
Violette et al. "Silicon Nucleation and Film Evolution on Silicon Dioxide Using Disilane", *J. Electrochem. Soc.*, vol. 143, No. 2, Feb. 1996, pp. 649–656.
"Filling Contacts and Vias: A Progress Report", *Semiconductor International*, Feb. 1996, pp. 89–94.
Sugai et al, "Aluminum Chemical Vapor Deposition with New Gas Phase Pretreatment Using Tetrakisdimethylamino–titanium for Ultralarge–scale Integrated–Circuit Metallization", *J. Vac. Sci. Technol. B 13(5)*, Sep./Oct. 1995, pp. 2115–2118.

*Primary Examiner*—Charles Bowers
*Assistant Examiner*—Reneé R. Berry
*Attorney, Agent, or Firm*—Killworth, Gottman, Hagan & Schaeff LLP

[57] ABSTRACT

A method of forming a conformal aluminum film on a refractory metal nitride layer is provided and includes positioning a substrate having the refractory metal nitride layer thereon within a chemical vapor deposition chamber; establishing a nominal temperature for the substrate; introducing a carrier gas containing a gaseous, metalorganic precursor into the chamber for a time sufficient to form a metallic seed layer; and introducing a carrier gas containing a gaseous aluminum metalorganic precursor into the chamber for a time sufficient to form a conformal aluminum metal film over the metal refractory nitride layer.

13 Claims, 2 Drawing Sheets

METHOD OF DEPOSITING A SMOOTH CONFORMAL ALUMINUM FILM ON A REFRACTORY METAL NITRIDE LAYER

BACKGROUND OF THE INVENTION

This invention relates to the deposition of conformal aluminum films onto a refractory metal nitride layer, and more particularly to an improved deposition process in which pretreatment of the refractory metal nitride layer prior to deposition of the aluminum results in the production of a smooth film and essentially void free aluminum plug.

In the fabrication of integrated circuits, electrical contact must be made to isolated active device regions formed within a semiconductor wafer/substrate. The active device regions are connected by highly electrically conductive paths or lines which are fabricated above an insulator material which covers the substrate surface. To provide electrical connections between the conductive path and active device regions, an opening in the layer of insulator material is provided to enable the electrically conductive films to contact the desired regions. Such openings are typically referred to as contact openings or simply contacts. Ultimately, an electrically-conductive filling material such as tungsten metal would be provided in the contact opening for making electrical connections between the surface conductive paths and the active device regions on the substrate.

As transistor active area dimensions have approached less than one-half micron in diameter on ultralarge scale integrated circuit (ULSI) devices, conventional process techniques have proved to be unable to meet the needs of providing low resistance paths to the contacts. One of the more difficult problems in semiconductor device fabrication has been the filling of via or contact holes that have only submicron diameters and high aspect ratios (i.e., high length to diameter ratios) of 4:1 or greater with metal. Sputtering techniques do not provide good step coverage at such high aspect ratio holes.

Chemical vapor deposition techniques do provide better results in filling such holes. Tungsten metal has been used as the plug material to fill high aspect ratio contact holes and vias in semiconductor device manufacture. However, tungsten, and the processes used to deposit the tungsten metal, have several drawbacks. Current chemical vapor deposition techniques for tungsten (W) use a tungsten fluoride gas (such as $WF_6$). The fluoride ions in the gas will attack the silicon surface of a semiconductor substrate. The tungsten metal itself may react with the silicon substrate. Additionally, while tungsten has reasonably low electrical resistivity, there are other metals with even lower resistivities which could provide a better electrical contact and flow path.

Chemical vapor deposition of aluminum has become increasingly important in the manufacture of semiconductor devices. Aluminum has always been used as a conductor material because of its properties of high conductivity, an electrical resistivity less than that of tungsten, high adherence, and low stress. Aluminum is thus a desirable candidate to serve as the electrically conductive material to fill the contact holes. However, aluminum films deposited using chemical vapor deposition (CVD) techniques have heretofore had rough surfaces, voids, and have not been conformal without further surface modification. Such surface roughness may lead to problems with later photolithography steps resulting in a decrease in resolution.

Attempts have been made to improve the quality of CVD aluminum films. It is believed that substrate pretreatment using a titanium-containing precursor improves the surface morphology of aluminum films by providing nucleation sites. One prior process uses chemical vapor deposition of $TiCl_4$ vapor to pretreat wafer substrates prior to aluminum deposition. The $TiCl_4$ molecules adsorb onto the substrate surface. However, residual chlorine at the interface between the substrate and aluminum has been known to cause corrosion of the aluminum metal.

More recently, metalorganic titanium compounds have been used to deposit titanium-containing species directly onto silicon and silicon dioxide surfaces as a pretreatment for later CVD of aluminum. See, Sugai et al, "Aluminum Chemical Vapor Deposition with New Gas Phase Pretreatment Using Tetrakisdimethylamino-titanium for Ultralarge-scale Integrated-Circuit Metallization", *J. Vac. Sci. Technol. B* 13(5), September/October 1995, pp. 2115–2118. However, again, problems may arise as the directly-deposited aluminum metal may attack the silicon and silicon dioxide surfaces.

Accordingly, the need still exists in this art for a technique and process of depositing a smooth and conformal layer of aluminum to produce a void free film in via holes and contacts for integrated circuits.

SUMMARY OF THE INVENTION

The present invention meets that need by providing a method of forming a conformal aluminum film which is smooth and void free on a refractory metal nitride barrier layer and involves an initial pretreatment of the refractory metal nitride layer. The process is useful with a number of different refractory metal nitrides. An advantage of the present invention is that both the pretreatment step and the aluminum deposition step may be carried out in the same chamber and at the same temperature range. There is no need to remove the substrate from the chamber or to transfer the substrate to a different location after pretreatment which saves time in processing.

The method of the present invention includes the steps of positioning a substrate having the refractory metal nitride layer thereon within a chemical vapor deposition chamber and establishing a constant nominal temperature for the substrate. A suitable temperature range is between about 0° to 600° C., and preferably of between about 50° to 300° C. A carrier gas containing a gaseous, metalorganic precursor is then introduced into the chamber for a time sufficient for the metalorganic precursor to form a seed layer. A carrier gas containing a gaseous aluminum metalorganic precursor is then introduced into the chamber for a time sufficient to form an aluminum metal film over the metal refractory nitride layer. Both the seed layer and the aluminum film are substantially free of halogens.

Accordingly, it is a feature of the present invention to provide a method of forming a conformal aluminum film which is smooth and void free on a refractory metal nitride barrier layer. This, and other features and advantages of the present invention, will become apparent from the following detailed description, the accompanying drawings, and the appended claims.

DETAILED DESCRIPTION OF THE PREFERRED EMBODIMENT

Refractory metal nitride barrier layers may be deposited onto substrates using sputtering techniques or preferably by chemical vapor deposition (CVD) techniques. Typically, they have layer thicknesses in the range of from about 100–250 Å. Such refractory metal nitride barrier layers are important in VLSI and ULSI semiconductor fabrication. They provide good junction integrity at metal/silicon substrate interfaces by providing a good electrically conductive path between the metal and substrate while protecting the substrate from attack by the metal.

We have discovered that if these refractory metal nitride barrier layers are pretreated, aluminum metal may be deposited onto their surfaces to produce smooth, void free, and conformal aluminum metal films. Such aluminum films may be deposited over a number of refractory metal nitrides including, but not limited to, titanium nitride, titanium aluminum nitride, titanium nitride silicide, tantalum nitride, tantalum nitride silicide, niobium nitride, and niobium nitride silicide. Titanium nitride is a preferred barrier layer material, and a process for the deposition of titanium nitride films is disclosed in commonly-assigned Sandhu et al, U.S. Pat. Nos. 5,252,518 and 5,254,499.

Figure 1:
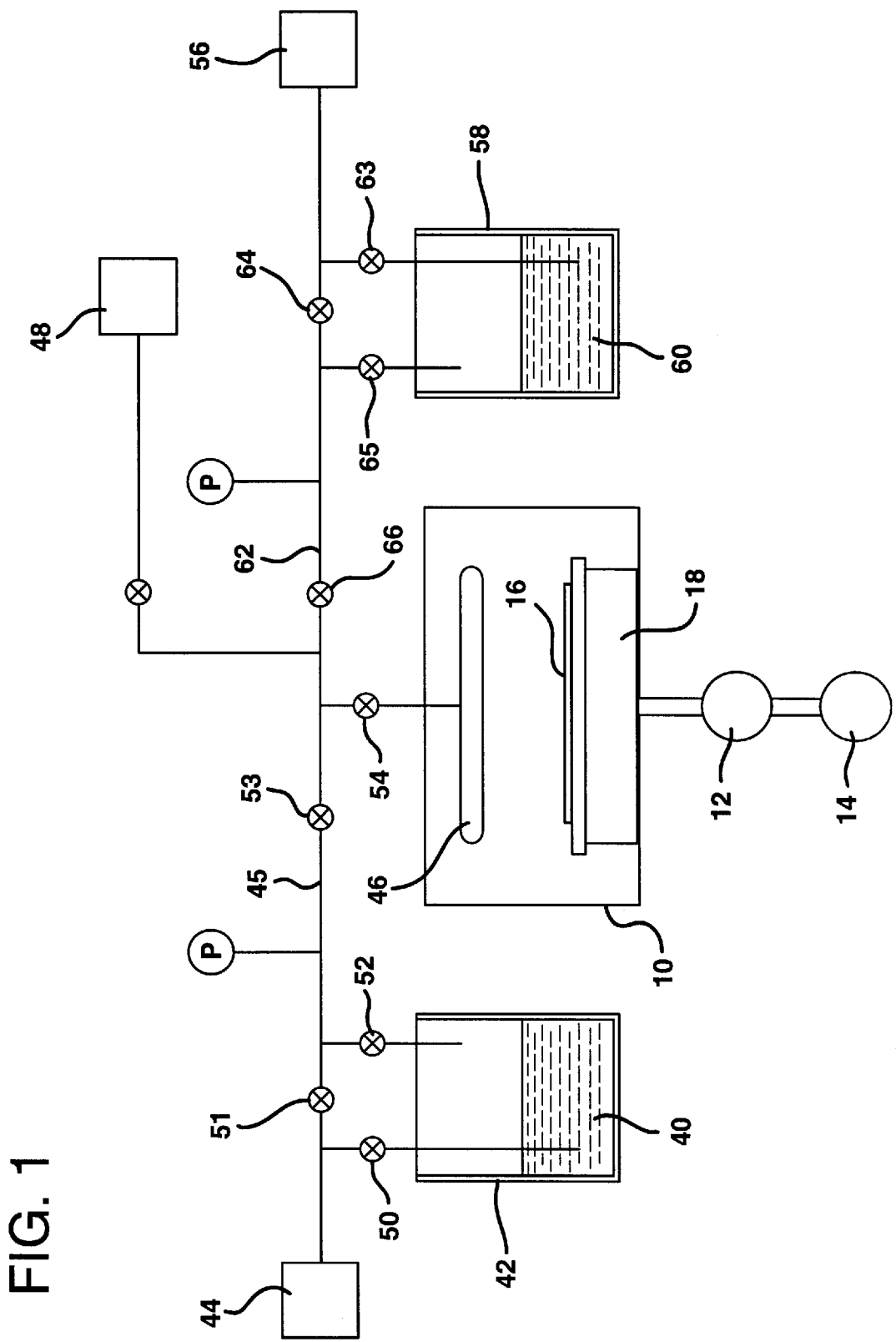
FIG. 1 is a schematic pictorial representation of a chemical vapor deposition system which can be used to perform the process of the present invention.

Referring now to FIG. 1, a chemical vapor deposition (CVD) system which can be used to perform the process of the present invention is depicted in schematic form. The system includes an enclosed chemical vapor deposition chamber 10, which may be a cold wall-type CVD reactor. As is conventional, the chemical vapor deposition process may be carried out at pressures of from atmospheric down to about $10^{-3}$ torr, and preferably from about 1.0 to 0.1 torr. A vacuum may be created in chamber 10 using turbo pump 12 and backing pump 14.

One or more semiconductor wafer substrates 16 are positioned in chamber 10. A constant nominal temperature is established for the substrate, preferably at a temperature of between about 0° to 600° C., and most preferably from about 50° to 300° C. Substrate 16 may be heated, for example, by an electrical resistance heater 18 on which substrate 16 is mounted. Other known methods of heating the substrate may also be utilized.

Figure 2:
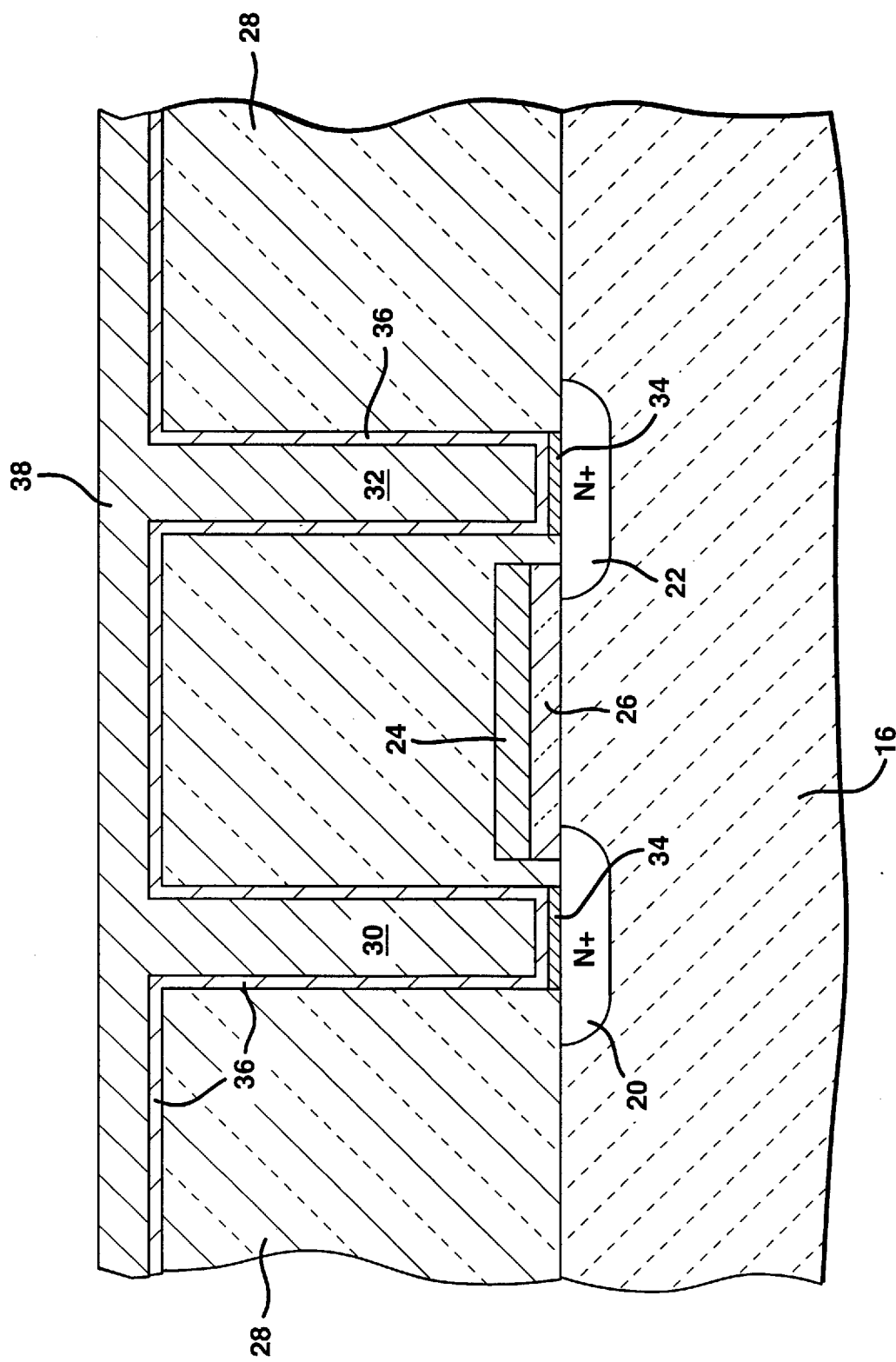
FIG. 2 is a partial side view, in cross section, of an example of a semiconductor contact having a conformal aluminum film deposited in accordance with the present invention.

The semiconductor substrate contains thereon one or more active devices and one or more layers of metal, oxides, barrier layers, and the like. The process of the present invention is applicable to any semiconductor device in which there is a need to deposit a smooth, conformal conductive metal film into a via or contact hole. Solely for the purpose of aiding in the understanding of the process, an example of such a device is shown in FIG. 2. It will be understood by those skilled in this art, however, that the process of the present invention is applicable to a variety of semiconductor devices and at various stages of fabrication.

As shown in FIG. 2, substrate 16 may be in the form of an n-channel MOSFET (n-channel metal-oxide semiconductor field-effect transistor) which may be used in a DRAM memory device. As shown, substrate 16 is a p-type silicon having two n-type silicon islands 20, 22 representing the transistor source and drain. Such a construction is well known. The gate for the transistor is formed by a metal/polysilicon layer 24 deposited over a silicon dioxide layer 26. A relatively thick layer of an insulating silicon dioxide 28 overlies the active areas on substrate 16.

To connect the MOSFET with conductive paths on the surface of the device, contacts 30, 32 have been etched through oxide layer 28 down to the surface of substrate 16. A metal or metal silicide layer 34, such as titanium silicide, is deposited and formed at the base of contacts 30, 32, and then a thin, conformal barrier layer of a refractory metal nitride 36 is deposited over the walls of the contacts. As discussed above, a number of refractory metal nitrides are useful in the practice of the present invention and include, but are not limited to, titanium nitride, titanium aluminum nitride, titanium nitride silicide, tantalum nitride, tantalum nitride silicide, niobium nitride, and niobium nitride silicide. Titanium nitride is preferred. Because of the presence of the conductive barrier layer, the electrical contact path is excellent and the aluminum metal which is deposited over the refractory metal nitride barrier layer is prevented from attacking the substrate surfaces.

As greater numbers of active devices have been arranged on a semiconductor substrate, the dimensions of those devices has become smaller. As a consequence, the contacts 30, 32 which are formed have diameters of as small as $0.25\mu$, but lengths of up to $2.0\mu$. This results in contacts having very high aspect ratios (length to diameter).

In order to obtain a conformal aluminum metal film 38 in such contacts, we have determined that it is desirable to pretreat the surface of the refractory metal nitride layer with a metalorganic precursor prior to the chemical vapor deposition of aluminum. Such pretreatment is carried out in the same chemical vapor deposition chamber as the aluminum deposition, and is also preferably carried out at the same temperatures. This simplifies the processing of the semiconductor and speeds the fabrication process.

Referring back now to FIG. 1, a metalorganic precursor 40 is stored in liquid form in vessel 42. A source 44 of a suitable inert gas such as, for example, helium, nitrogen, argon, or hydrogen is pumped into vessel 42 and bubbled through the liquid, picking up the metalorganic precursor and carrying it into chamber 10 through line 45 and gas distributor 46. Additional inert carrier gas may be supplied from source 48 as needed to provide the desired concentration of metalorganic precursor and regulate the uniformity of the deposition across the surface of substrate 16. As shown, a series of valves 50–54 are opened and closed as required.

Generally, the metalorganic precursor is pumped into the CVD chamber 10 at a flow rate of from about 1 to 1000 sccm. The semiconductor substrate is exposed to the metalorganic precursor at a pressure of from about 0.001 to 100 torr for a time of from about 0.01 to 100 minutes. In chamber 10, the metalorganic precursor will form an adsorbed layer on the surface of refractory metal nitride 36. The layer is highly conformal as it relies on surface adsorption for its deposition. The metalorganic precursor monolayer serves as a uniform "seed" layer for the later aluminum film, with this seed layer acting as nucleation sites for the aluminum. The seed layer may contain metal in reduced or partially reduced form.

Metalorganic compounds useful in the practice of the present invention have the potential to adsorb on a refractory metal nitride surface and decompose or partially decompose on that surface to yield active sites for the later aluminum deposition. Preferred metalorganic precursors are those that are liquids at room temperature but which exhibit significant vapor pressures at elevated temperatures and which reduce when deposited to form conductive metals. Substantially halogen-free precursors are preferred to prevent later possible corrosion of the deposited metal from residual halogens. However, other metalorganic precursors may be utilized if they produce seed layers which are substantially halogen free.

One class of suitable substantially halogen-free metalorganic precursors has the formula M–L$_4$, where M is a metal selected from the group consisting of Ti, Zr, and Hf, and where L is a hydrocarbyl group, boron hydride, or an amino group. For purposes of this invention, the term hydrocarbyl group is meant to encompass any group containing hydrogen and carbon, hydrogen and silicon, or hydrogen and nitrogen. Another class of suitable halogen-free metalorganic precursors has the formula M–L$_5$, where M is a metal selected from the group consisting of V, Nb, and Ta, and where L is a hydrocarbyl group or an amino group. Yet another suitable class of halogen-free metalorganic precursors has the formula M–L$_3$, where M is a metal selected from the group consisting of Rh and Ir, and where L is a hydrocarbyl group. Such metalorganic precursors are commercially available. Typical exemplary metalorganic precursor compositions include (C$_5$H$_5$)PtMe$_3$, (C$_5$H$_{5-x}$R$_x$)PtR$_3$, (C$_5$H$_5$)Ti(C$_7$H$_7$), V(CO)$_6$, (C$_5$H$_5$)$_2$V, (C$_5$H$_5$)V(CO)$_4$, (C$_5$H$_5$)Nb(CO)$_4$, (C$_5$H$_5$)Ta(CO)$_4$, (C$_5$H$_5$)Ti(BH$_4$)$_3$, (C$_5$H$_5$)Zr(BH$_4$)$_3$, and (C$_5$H$_5$)Hf(BH$_4$)$_3$.

Once a monolayer of the metalorganic precursor has been deposited, the flow of carrier gas through line 45 is terminated by closing valve 53. A flow of carrier gas containing the gaseous aluminum metal organic precursor is then started by pumping inert gas from source 56 through vessel 58 where a supply of the precursor in liquid form is stored. Again, concentration of the aluminum precursor in the carrier gas may be controlled by the addition of inert gas from source 48 into line 62. Valves 63–66 control the flow of the gas into chamber 10.

An advantage of the process of the present invention is that the substrate may be pretreated and then the aluminum film deposited without the need to remove the substrate from the chamber or to transfer the substrate to a different location. Further, the temperature of the substrate may be maintained within the same preferred 0° to 600° C. range so that there are no delays between steps in the process. In a preferred embodiment of the invention, the substrate is maintained at substantially the same temperature throughout the process.

The aluminum metalorganic precursor is preferably selected from the group consisting of dimethyl aluminum hydride (DMAH) and dimethyl ethyl amine alane (DMEAA). Both of these compounds are readily available, are substantially halogen free, and provide good aluminum deposition rates. Preferably, the aluminum metalorganic precursor is pumped into CVD chamber 10 at a flow rate of from about 1 to 1000 sccm. The adsorbed seed monolayer on the surface of substrate 16 is exposed to the aluminum metalorganic precursor at a pressure of from about 0.001 to 100 torr for a time of from about 0.01 to 100 minutes. As the deposition rate is temperature dependent, increasing the temperature of the substrate will increase the rate of deposition. Typical deposition rates are from about 1000 to 10,000 Å/min.

As aluminum atoms are deposited and grow at nucleation sites on the seed monolayer, a conformal aluminum film 38 will be deposited as shown in FIG. 2. We have found this aluminum film to have greater surface smoothness than prior art films. Both root-mean-square (RMS) and peak-to-peak surface roughness are less than 50 Å and 500 Å, respectively. The film is essentially void free, halogen free, and provides an excellent electrically conductive pathway.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A method of forming an aluminum film on a refractory metal nitride layer comprising the steps of:

positioning a substrate having said refractory metal nitride layer thereon within a chemical vapor deposition chamber;

establishing a temperature for said substrate;

introducing a carrier gas containing a gaseous, substantially halogen free metalorganic precursor into said chamber for a time sufficient to form a seed layer, wherein said metalorganic precursor has the formula: (1) M–L$_4$, where M is a metal selected from the group consisting of Ti, Zr, and Hf, and where L is a hydrocarbyl group, boron hydride, or an amino group; or (2) M–L$_5$, where M is a metal selected from the group consisting of V, Nb, and Ta, and where L is a hydrocarbyl group or an amino group; or (3) M–L$_3$, where M is a metal selected from the group consisting of Rh and Ir, and where L is a hydrocarbyl group; and introducing a carrier gas containing a gaseous aluminum metalorganic precursor into said chamber for a time sufficient to form an aluminum metal film over said metal refractory nitride layer.

2. A method as claimed in claim 1 in which said substrate is maintained at a temperature of between about 0° to 600° C.

3. A method as claimed in claim 1 in which said substrate is heated to a temperature of between about 50° to 300° C.

4. A method as claimed in claim 1 in which said substrate is maintained at substantially the same temperature throughout the process.

5. A method as claimed in claim 1 in which said aluminum metalorganic precursor is selected from the group consisting of dimethyl aluminum hydride and dimethyl ethyl amine alane.

6. A method as claimed in claim 1 wherein said refractory metal nitride is selected from the group consisting of titanium nitride, titanium aluminum nitride, titanium nitride silicide, tantalum nitride, tantalum nitride silicide, niobium nitride, and niobium nitride silicide.

7. A method as claimed in claim 1 in which said substrate is a semiconductor wafer and said refractory metal nitride layer is deposited in a contact hole having an aspect ratio of 4:1 or greater.

8. A method as claimed in claim 1 in which said seed layer and said aluminum metal film are substantially halogen free.

9. A method of forming an aluminum film on a refractory metal nitride surface comprising the steps of:

placing a substrate having said refractory metal nitride surface thereon within a chemical vapor deposition chamber;

establishing a temperature for said substrate;

introducing a carrier gas containing a gaseous, substantially halogen free metalorganic precursor into said chamber to form a seed layer on said substrate, wherein said metalorganic precursor has the formula: (1) M–L$_4$, where M is a metal selected from the group consisting of Ti, Zr, and Hf, and where L is a hydrocarbyl group, boron hydride, or an amino group; or (2) M–L$_5$, where M is a metal selected from the group consisting of V, Nb, and Ta, and where L is a hydrocarbyl group or an amino group; or (3) M–L$_3$, where M is a metal selected from the group consisting of Rh and Ir, and where L is a hydrocarbyl group; and without removing said substrate from said chamber, introducing a carrier gas containing a gaseous aluminum metalorganic precursor into said chamber for a time sufficient to form an aluminum metal film over said metal refractory nitride layer.

10. A method as claimed in claim 9 in which said substrate is maintained at a temperature of between about 0° to 600° C.

11. A method as claimed in claim 9 in which said substrate is heated to a temperature of between about 50° to 300° C.

12. A method as claimed in claim 9 in which said substrate is maintained at substantially the same temperature throughout the process.

13. A method of forming an aluminum layer on a substrate comprising the steps of:

providing a substrate having a refractory metal nitride surface thereon;

placing said substrate within a chemical vapor deposition chamber;

exposing said substrate to a substantially halogen free metalorganic precursor having the formula: (1) $M-L_4$, where M is metal selected from the group consisting of Ti, Zr, and Hf, and where L is a hydrocarbyl group, boron hydride, or an amino group; or (2) $M-L_5$, where M is a metal selected from the group consisting of V, Nb, and Ta, and where L is a hydrocarbyl group or an amino group; or (3) $M-L_3$, where M is a metal selected from the group consisting of Rh and Ir, and where L is a hydrocarbyl group; and exposing said substrate to an aluminum metalorganic precursor.

* * * * *